United States Patent [19]

Miki et al.

[11] Patent Number: 5,055,990

[45] Date of Patent: Oct. 8, 1991

[54] SNUBBER CIRCUIT FOR POWER CONVERSION SEMICONDUCTOR ELEMENTS AND ASSEMBLY THEREOF

[75] Inventors: Hiroshi Miki, Tokyo; Yoshitaka Fujiwara, Koube; Kiyoshi Iida, Matumoto; Hiromu Takubo, Tokyo; Kunio Shibayama, Koube; Shinichi Kobayashi, Matumoto, all of Japan

[73] Assignee: Fuji Electric Co., Ltd., Japan

[21] Appl. No.: 466,515

[22] Filed: Jan. 17, 1990

[30] Foreign Application Priority Data

Jan. 17, 1989 [JP] Japan .................................... 1-8311
Jul. 19, 1989 [JP] Japan .................................... 1-186969
Oct. 2, 1989 [JP] Japan .................................... 1-257294

[51] Int. Cl.[5] .................................... H02M 7/538
[52] U.S. Cl. .................................... 363/56; 363/132
[58] Field of Search .................. 363/56, 58, 132, 136, 363/137, 68, 138; 361/91, 111; 307/318, 641, 633

[56] References Cited

U.S. PATENT DOCUMENTS 3,508,140 4/1970 Moses .................................... 307/318
4,095,163 6/1978 Montague .................................... 307/318
4,520,279 5/1985 Glennon .................................... 318/519

FOREIGN PATENT DOCUMENTS 1151313 7/1963 Fed. Rep. of Germany ...... 307/318
WO88/09085 11/1988 Int'l Pat. Institute .
133988 10/1981 Japan .................................... 363/56
6573 1/1982 Japan .................................... 363/56
1178029 1/1970 United Kingdom .
2074799 11/1981 United Kingdom ................ 363/132

OTHER PUBLICATIONS

IEEE Transactions of Industrial Electronics; vol. IE-33, No. 2, May 31, 1986, New York, U.S., pp. 185-192; K. S. Rajashekara et al., "Protection and Switching-Aid Networks for Transistor Bridge Inverters".

*Primary Examiner*—William H. Beha, Jr.
*Attorney, Agent, or Firm*—Brumbaugh, Graves, Donohue & Raymond

[57] ABSTRACT

A snubber network of high energy efficiency for use with power conversion semiconductors is described. Asymmetrical semiconductor elements are used to reduce and dissipate voltage spikes induced by stray inductance during turn-off of power semiconductors. A space efficient assembly using the described snubber network containing asymmetrical semiconductor elements and an external snubber capacitor is also described.

19 Claims, 7 Drawing Sheets

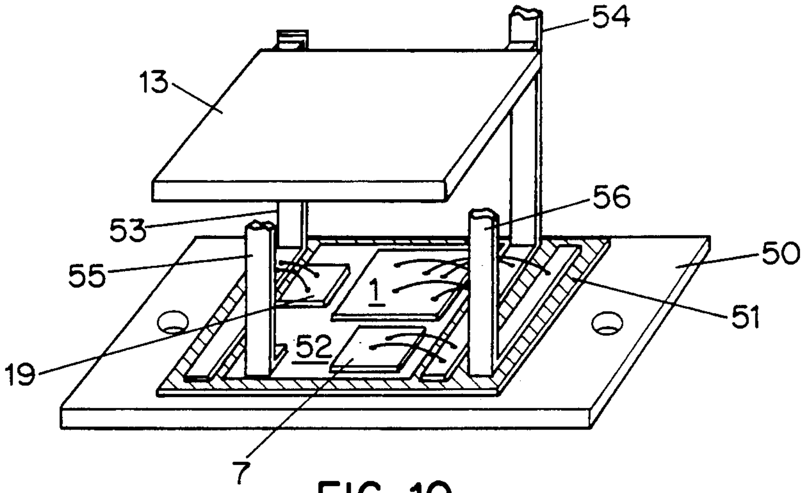
FIG. 10
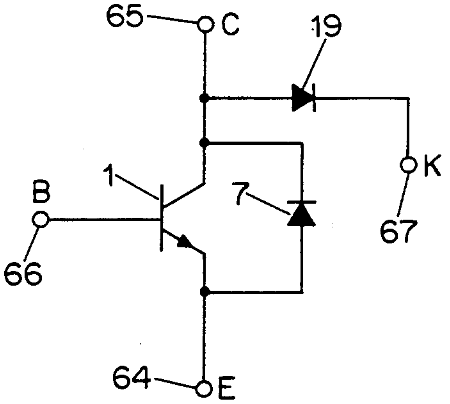
FIG. 11
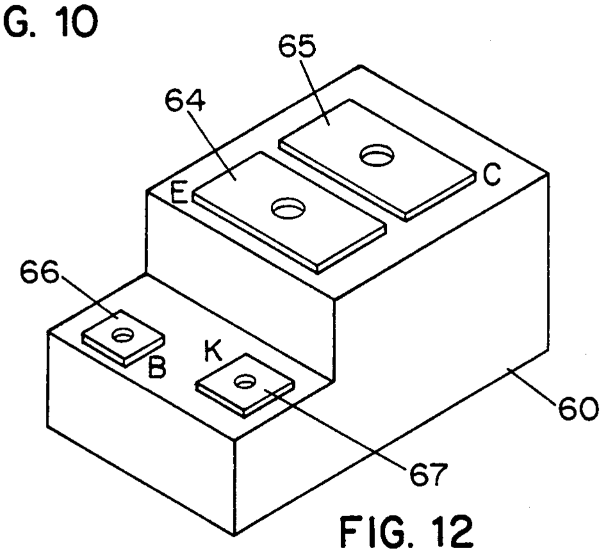
FIG. 12
FIG. 14
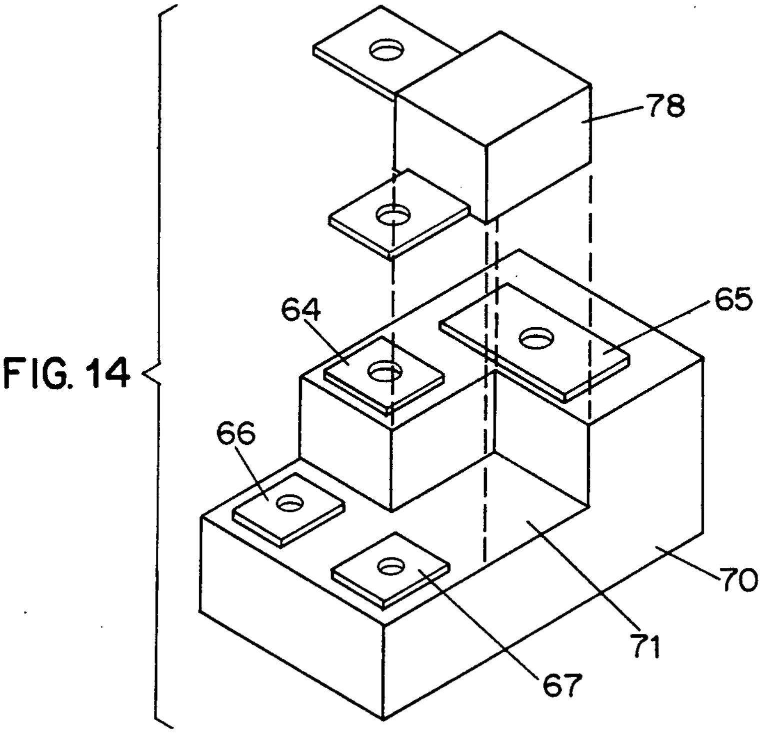

SNUBBER CIRCUIT FOR POWER CONVERSION SEMICONDUCTOR ELEMENTS AND ASSEMBLY THEREOF

BACKGROUND OF THE INVENTION

1. Field of the Invention

The present invention relates to snubber circuit configurations for protecting semiconductor elements during operation of a power conversion assembly including one or more self turn off power semiconductor elements.

2. Description of Related Art

It is well known that by use of a pair of power transistors, for example, connected in series as a self turn off power semiconductor element, with this series circuit connected between the positive and negative terminals of a DC power supply, DC to AC power conversion can be achieved by alternating between the ON and OFF states of the two power transistors. For three phase AC output, three pairs of series circuits of such power transistor pairs are connected in parallel, commonly connected to a DC power supply. Hereafter, the prior art and the present invention will be explained in detail with examples of how DC power from a DC power supply is converted to 3-phase AC power by a 3-phase inverter by the use of three similar assemblies.

The ON to OFF condition of each of the six transistors typically part of a three phase DC to AC inverter is determined by the driving circuits not shown herein, but well known in the art. It is the function of the drive circuits associated with such an inverter as described herein to insure that the transistors will go into saturation when turned ON and will be cut off, or turned OFF at the proper time. The drive circuits will supply the transistors a base drive signal so that when one transistor of a series string is ON, the other is OFF. Furthermore, the relationship between the ON to OFF time of the three strings of two series transistors each will be arranged so that the relative timing relationships of the three phases of an AC power line, usually desired to be spaced 120 electrical degrees apart, will be preserved.

The ON to OFF time ratio of the series pair of transistors in each of the three two transistor strings is determined by the load that the inverter is supplying. This ratio is determined by the control circuitry associated with the drive circuits not shown herein.

Note that the two transistors can never be ON at the same time, or else they would appear as a short across the DC supply, and self-destruct. Therefore, it is imperative that high energy spikes created during the switching of the power devices be well attenuated in the snubber circuits to allow the unimpeded operation of the transistor drive circuits.

In a 3-phase inverter formed by power transistors, each power transistor is typically connected reversely in parallel with a free wheeling diode. In this configuration when a surge voltage, induced by (di/dt) is generated by the stray inductance of the circuit excited by the power transistor being turned OFF (or the reverse recovery time of the free wheeling diode), the power transistor in question may be damaged. Moreover, when the rising rate (dV/dt) of the collector to emitter voltage of such power transistor is large while the power transistor turns OFF, the other power transistors or control circuits may malfunction. Accordingly, a snubber circuit in accordance with this invention is incorporated in a 3-phase inverter in order to avoid such malfunctions, and generally reduce the dV/dt effects.

FIG. 19 is a circuit diagram indicating a first example of a prior art snubber circuit incorporated in a power conversion unit.

In FIG. 19, the numerals 1 to 6 designate six power transistors and 7 to 12, the associated six free wheeling diodes. Each of these six power transistors is connected "in parallel" in the form of a 3-phase bridge as shown with the free wheeling diodes and each power transistor also having connected in parallel with them a snubber circuit formed by a series connected capacitor and resistor. The numerals 13 to 18 designate six capacitors forming part of such snubber circuit. Numerals 33 to 38 designate resistors also part of the snubber circuit. The numeral 25 designates a DC power supply and 32, the stray inductance of the circuit.

Such snubber circuit formed by resistors and capacitors is generally called an R-C snubber circuit. The capacitors comprised within such R-C snubber circuit suppress a surge voltage generated when the power transistor connected to this R-C snubber circuit turns OFF. The circuit also suppresses high dV/dt of the collector to emitter voltage of this power transistor through charging of the these snubber capacitors. It is preferable to minimize the resistance value of the resistors forming the R-C snubber circuit in order to improve the suppression effect of the possibly destructive high dV/dt surge condition.

FIG. 20 is a circuit diagram indicating a second example of a prior art snubber circuit incorporated in a power conversion unit.

In FIG. 20, six power transistors 1 to 6, six associated free wheeling diodes 7 to 12, a DC power supply 25 and a stray inductance 32 represent the same function as those in FIG. 19.

In the second prior art circuit shown in FIG. 20, the snubber circuit (generally called a R-C-D snubber circuit) formed by the resistor 28, capacitor 30 and diode 27 is connected between the positive and negative electrodes of the DC power supply 25. In this configuration, the capacitor 30 absorbs the energy induced by the stray inductance 32 of the circuit when the power transistor turns OFF, thereby suppressing the surge voltage, or high dV/dt condition.

FIG. 21 is a circuit diagram showing a third example of a prior art snubber circuit incorporated into a power conversion assembly.

FIG. 21 combines the first prior art circuit shown in FIG. 19 and the second prior art circuit shown in FIG. 20 and described previously. The six transistors forming a 3-phase DC to AC inverter are connected respectively in parallel with an individual R-C snubber circuit and also connected with the R-C-D snubber circuit across the positive and negative electrodes (collector and emitter) of the six transistors.

FIG. 22 is a circuit diagram indicating a fourth prior art form of snubber circuit incorporated in a power conversion unit. The six transistors forming a 3-phase inverter are connected in parallel with individual R-C-D snubber circuits and are also connected with the R-C-D snubber circuit across the positive and negative electrodes of the power transistors.

In the prior art circuits described above, if the diode or resistor connected in series with the capacitor forming the snubber circuit is removed to form a snubber circuit consisting of the capacitor only, when the power transistor turns OFF, a resonant phenomenon is generated by the capacitor and stray inductance 32 of the circuit. Since this phenomenon creates problems such as the generation of noise and an increase in the duty cycle of the power transistor, a resistor is connected in series with the capacitor to suppress the electrical waveforms generated by the resonance.

The R-C snubber circuit and R-C-D snubber circuit of the prior art described above have various disadvantages.

In the R-C-D snubber circuit, 1) the resistor must be made large in size because of the losses associated with the current required to charge the capacitor and also discharged through such resistor; 2) because of the presence of the resistor, a control circuit may be improperly triggered by a malfunction caused by the high dV/dt spike generated when the diode of the snubber circuit recovers reversely; and 3) the part count is necessarily high because the snubber circuit is relatively complicated in structure.

Meanwhile, in the plain R-C snubber circuit, 1) the resistor energy loss becomes large since the capacitor is charged or discharged through the resistor and 2) because of the associated power dissipation, the resistor is large in size.

In addition, these snubber circuits further provide disadvantages in that each connection of elements forming the snubber circuits to respective semiconductor elements for power conversion not only results in troublesome assembly procedures but also increases the wiring inductance between the semiconductor element for power conversion and the snubber circuit. This also results in a part count increase of the snubber circuits and a corresponding increase in the size of the conversion unit or assembly.

It is therefore an object of the present invention to realize reduction in parts count and energy loss through a simplified structure of the snubber circuit incorporated in the semiconductor assembly for power conversion. Also, reduction in size of the power conversion unit using snubber circuits and reduction of wiring inductance through integration of the semiconductor element and the snubber circuit is also a goal.

SUMMARY OF THE INVENTION

In order to achieve this goal, the snubber circuit of the present invention relates to a circuit and subassembly for power conversion consisting of a series circuit of one or more self turn off power semiconductor elements. DC to AC power conversion is achieved by repeating alternately the ON and OFF states of the one or the other self turn off power semiconductor elements. A series circuit comprising an asymmetrical semi-conductor element providing small forward voltage drop and large backward voltage drop and a capacitor is connected in parallel to the series circuit of the self turn off power semiconductor elements or to the individual self turn off power semiconductor elements. Moreover, a subassembly of the present invention consists of a self turn off power semiconductor element connected in parallel to the disclosed snubber circuits. Said snubber circuits are formed from constant voltage (Zener) diode elements. These diodes are arranged in the physical structure on a pattern which is formed from conductive material on an insulated substrate adhered on a thermally conductive plate. The anode side of the self turn off power semiconductor element (collector), the cathode electrode of the free wheeling diode and the anode electrode of the constant voltage (Zener) diode are adhered on said conductive pattern. A first electrode and a second electrode separated from the conductive pattern are mutually isolated and are adhered on the insulated substrate. On final assembly, the one terminal of a snubber capacitor is connected to the first electrode and the other terminal of the capacitor to the second electrode, the capacitor being supported by these first and second electrodes. The cathode terminal of the constant voltage (Zener) diode is connected to the first electrode, the cathode side of the self turn off power semiconductor element and the anode of the free wheeling diode are connected to the second electrode. The conductive pattern, second electrode and the control element of the self turn off power semiconductor element are made electrically available to external circuits by providing an electrical connector to the outside. The assembly having the self turn off power semiconductor element includes a free wheeling diode connected reversely in parallel thereto and the constant voltage (Zener) diode connected to the anode of said self turn off power semiconductor element. These are hermetically sealed in a synthetic resin mold, while providing a cut-out part for accommodating a capacitor for snubber circuit connected to the other electrode connected to the constant voltage (Zener) diode.

In yet another embodiment, the self turn off power semiconductor element has a free wheeling diode connected reversely in parallel thereto. The constant voltage (Zener) diode is connected to the one electrode of said power semiconductor element and hermetically sealed in a synthetic resin mold of rectangular parallel-piped shape. The anode electrode terminal of the self turn off power semiconductor element is provided at one end of the surface of the rectangular parallel-piped shape, the cathode electrode terminal of this self turn off power semiconductor element is provided at the opposite end of the same surface, in the same plane as said anode electrode terminal. A recessed area accommodating a capacitor for the snubber circuit is provided in the intermediate area of the anode electrode terminal of such rectangular parallel-piped shape and cathode electrode terminal. The other electrode terminal of the constant voltage (Zener) diode is provided in this recessed area to facilitate connection to said snubber capacitor.

In accordance with he present invention, a power conversion section for use in a DC to AC power conversion assembly having a snubber network for use with self turn-off semiconductor elements is described. This conversion assembly is made up of a self turn off semiconductor element arranged to alternatively turn ON and OFF in response to a control signal and a snubber circuit. The snubber circuit is coupled in parallel with the self-turnoff semiconductor element. The snubber circuit is made up of a series arrangement of two elements. The first element of the snubber circuit is an asymmetrical voltage drop semiconductor, such as a Zener diode, which has a predetermined voltage drop during forward conduction and a larger voltage drop during backwards conduction. The second of the series elements of the snubber circuit is a charge storage device, such as a capacitor. The interaction of the asymmetrical semiconductor means and the charge storage means resulting from the asymmetrical voltage drop permits effective surge reduction with limited energy loss. The surge is typically induced by the rapid turn-off of the self turn off semiconductor operating in conjunction with stray inductance, or in the alternative, because of the switching action of some other circuit element.

The invention further describes a single phase power conversion assembly made up of two sections, each section being made up of a conversion assembly as described above. These two sections are typically coupled in series across a DC supply. The AC output is obtained where the two series sections join. A free wheeling diode is usually included in parallel across each of the sections.

Three such conversion assemblies, made up of two sections each, can be coupled across a DC power supply to create a three phase AC converter. In this configuration, each of the six sections is driven by ON-OFF control signals that are typically timed to synthesize a three phase AC output.

Function

In operation of the present invention, an asymmetrical element which shows a small forward voltage drop and a large backward voltage drop, for example, a constant voltage (Zener) diode is connected in series to a capacitor as a snubber circuit. Thereby, a resistor in a snubber circuit which has comparatively large power loss can be replaced. With replacement of such resistor, resonance generated by the snubber capacitor and stray inductance can be rapidly attenuated due to small but effective power loss generated in the asymmetrical element. The self turn off power semiconductor element for power conversion and its snubber circuit may be considered as one circuit and can be reduced in size and handled easily by integrating the snubber circuits consisting of the constant voltage diode and capacitor into a single assembly with the self turn off power semiconductor element and the free wheeling diodes connected reversely in parallel. Moreover, only the semiconductor elements, namely the constant voltage (Zener) diode and the self turn off semiconductor element and free wheeling diode of the snubber circuit are hermetically sealed in a synthetic resin mold. The necessary terminals for connection to other elements are provided. In addition, a cut-out part for the capacitor for the snubber circuit is provided in this resin mold in order to reduce the size of the assembly, wiring inductance and overall parts count.

BRIEF DESCRIPTION OF THE DRAWINGS

FIG. 10 is a structural diagram showing the physical embodiment of a power conversion module of the present invention;

FIG. 11 is a circuit diagram of a power conversion module formed only of semiconductor elements;

FIG. 12 is an external view of a power conversion module including the semiconductor elements included in the circuit shown in FIG. 11;

FIG. 14 is an external view of the second embodiment of the power conversion module (module unit) of the present invention;

DESCRIPTION OF THE PREFERRED EMBODIMENTS

Figure 1:
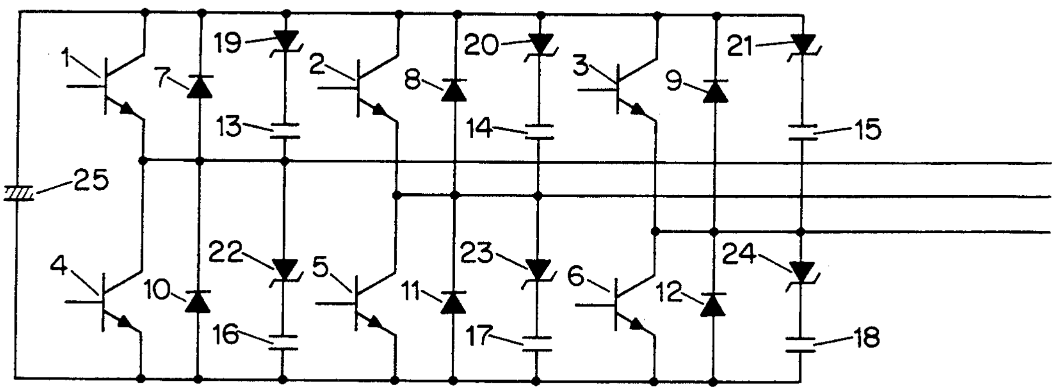
FIG. 1 is a circuit diagram indicating a first embodiment of three single phase power conversion assemblies of the present invention connected to form a three phase power conversion assembly.

FIG. 1 is a circuit diagram indicating a first embodiment of a power conversion assembly utilizing a snubber circuit in accordance with the present invention.

Figure 19:
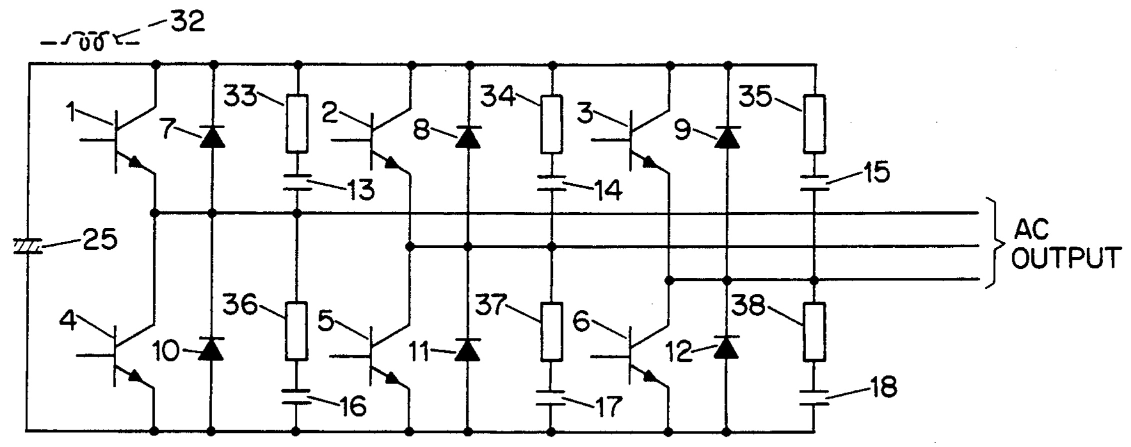
FIGS. 19, 20, 21 and 22 are circuit diagrams indicating examples of a prior art snubber circuits used in power conversion units.
Figure 20:
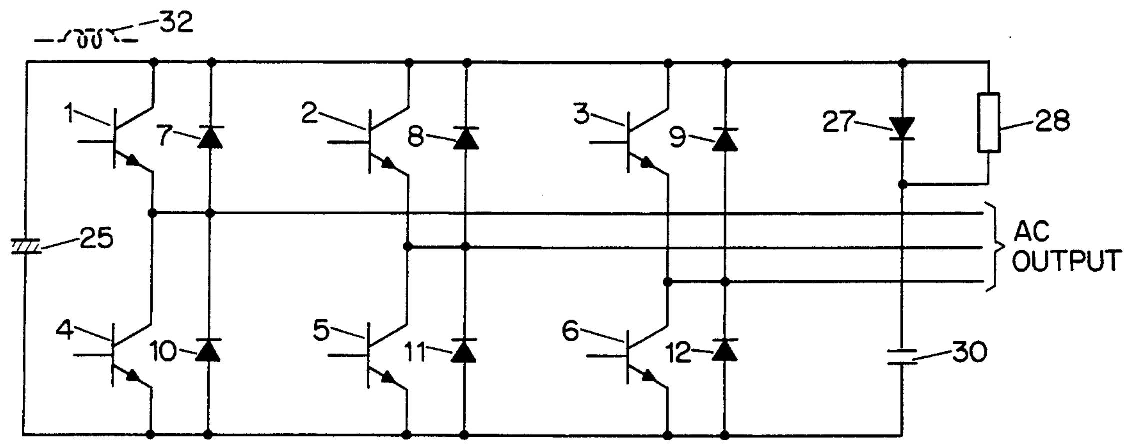
Figure 21:
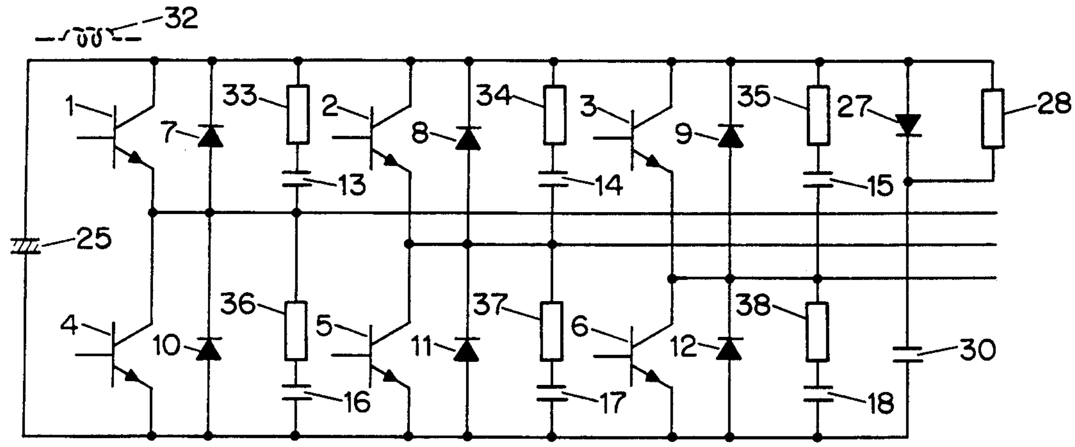
Figure 22:
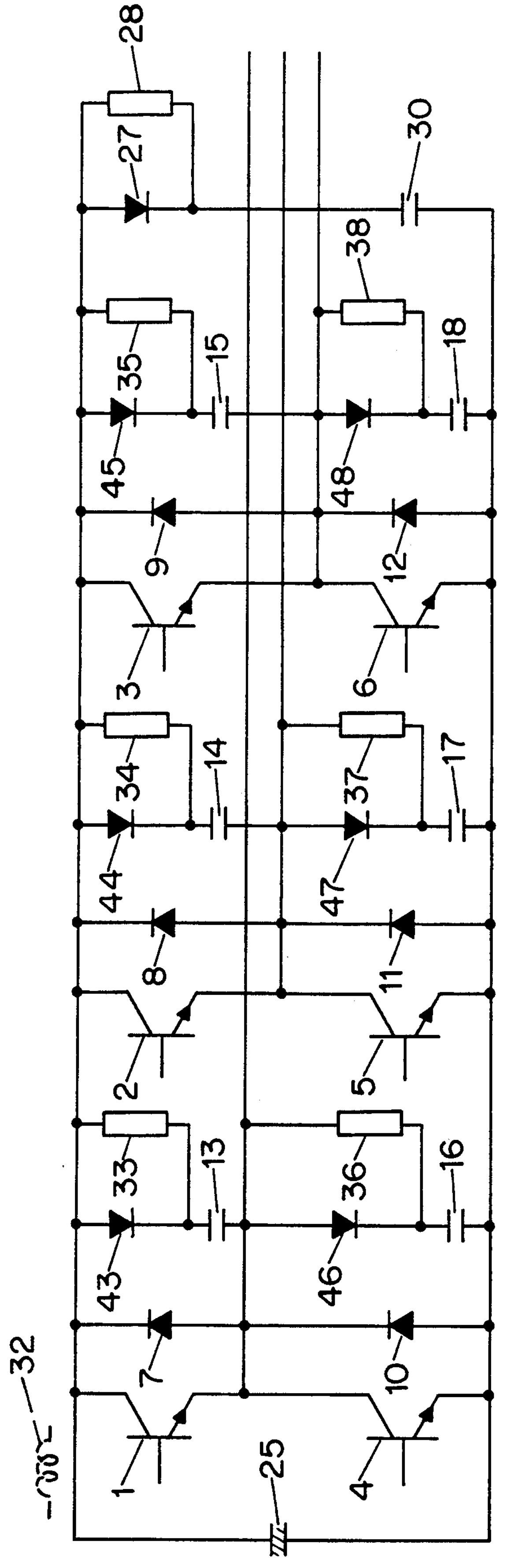

In FIG. 1, the functions of six power transistors 1 to 6 as the self turn off power semiconductor elements, six free wheeling diodes 7 to 12 and a DC power supply 25 are same as that of those in the first prior art circuit described with regard to FIG. 19 and are not explained here.

In the present invention, the circuit is formed of six constant voltage (Zener) diodes 19 to 24 as the six asymmetrical elements and six capacitors 13 to 18 as the snubber circuit, in parallel with the six power transistors 1 to 6 (self turn off power semiconductors).

Figure 2:
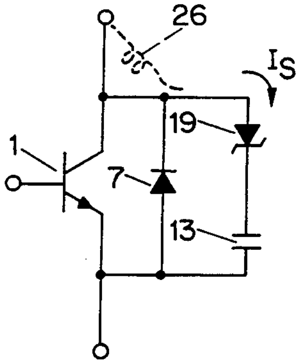
FIG. 2 is a circuit diagram showing a semiconductor element for power conversion and one arm or section of a snubber circuit used for the power conversion assembly shown in FIG. 1.

FIG. 2 is a circuit diagram of a semiconductor element for power conversion and one arm or section of the snubber circuit being used in the first embodiment of the power conversion assembly as shown in FIG. 1.

FIG. 2 shows a series circuit of the constant voltage (Zener) diode 19 as the voltage drop asymmetrical element and a capacitor 13 connected in series to the power transistor 1 (the numeral 7 designates a free wheeling diode). In this case a Zener voltage of constant voltage (Zener) diode 19 is set to a value lower than the voltage of DC power supply 25, however, depending on application, the value may be different.

A surge voltage generated when the power transistor 1 turns OFF is absorbed by a capacitor 13 through the constant voltage (Zener) diode 19. When the static capacitance of capacitor 13 is C and a current flowing through the capacitor 13 is $I_s$, the forward voltage drop at the constant voltage (Zener) diode 19 because of the current $I_s$ can be neglected. An induced dV/dt applied to the power transistor 1 becomes $I_s/C$. This dV/dt effect is suppressed by the snubber and thereby the turn-off burden or difficulty or stress of power transistor 1 during turn OFF is alleviated.

Figure 3:
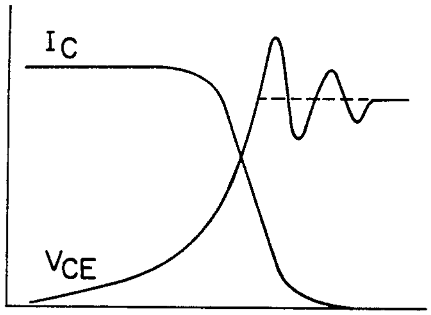
FIG. 3 and FIG. 4 show waveforms related to operation of the snubber network and single power conversion section shown in FIG. 2.
Figure 4:
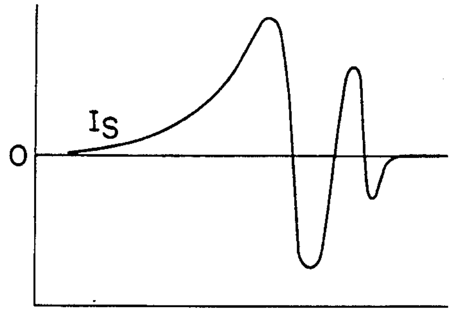

FIG. 3 and FIG. 4 indicate the waveforms relating to the operation of the single power conversion section or arm shown in FIG. 2. FIG. 3 shows changes of collector current $I_C$, of power transistor 1 and collector to emitter voltage $V_{CE}$, and FIG. 4 shows changes of current Is flowing into the capacitor 13 as a function of time.

When the power transistor 1 turns OFF and the collector to emitter voltage $V_{CE}$ rises up to a voltage value of the DC power source 25 (point A in FIG. 3), resonance with the capacitor 13 is induced by the current flowing through the stray inductance 25 of the circuit. Some of the resonant current now flows into the snubber circuit. Because of the polarity of the resonant current applied, the constant voltage (Zener) diode 19 consumes energy and therefore such resonance phenomenon can be dissipated within a comparatively short time period. As a result, the duty cycle of capacitor 13 can be reduced. Capacitor 13 represents an available means for storing an electrical charge.

The loss generated in the constant voltage diode 19 is converted to heat and since the Zener diode 19 is a semiconductor, it can be cooled easier than a resistor.

Figure 5:
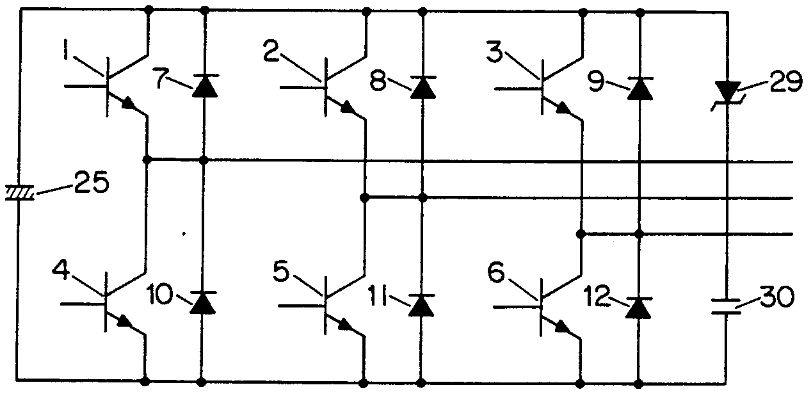
FIG. 5 is a circuit diagram indicating a second embodiment of a power conversion assembly of the present invention.

FIG. 5 is a circuit diagram indicating the second embodiment of the snubber circuit of the present invention where a series circuit of the constant voltage (Zener) diode 29 as the asymmetrical element, and capacitor 30 is connected between the positive and negative electrodes of a 3-phase inverter formed by six power transistors 1 to 6 and six free wheeling diodes 7 to 12. The Zener voltage of this constant voltage diode 29 is set to a value lower than the voltage value of the DC power supply 25.

Figure 6:
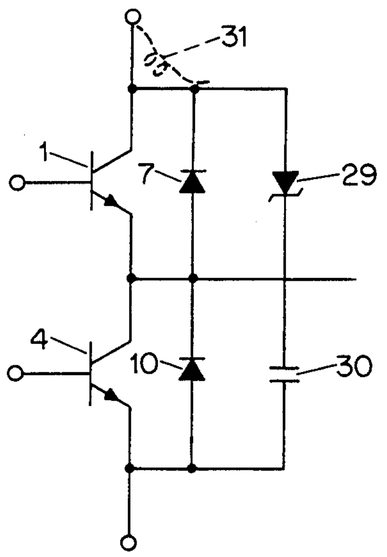
FIG. 6 is a circuit diagram of a single phase power conversion assembly used for the second embodiment shown in FIG. 5.

FIG. 6 is a circuit diagram of the circuit associated with a single phase of a three phase power conversion circuit. The snubber circuit used is that shown in FIG. 5.

A snubber circuit formed by a series circuit of the constant voltage diode 29 and capacitor 30 is connected between the external terminals of the series circuit of the power transistors 1 and 4. An increasing rate of collector to emitter voltage (dV/dt) is suppressed differently than the first embodiment described above. A surge voltage is generated while power transistor 1 or 4 turn off. This surge is absorbed by the constant voltage diode 29 in conjunction with capacitor, or charge storage device, 30. Therefore, the power transistor which turns OFF can be protected from breakdown resulting by the surge voltage arising from the stray inductance 31 by the action of the snubber network.

Like the first embodiment, the snubber circuit of the second embodiment encounters a resonance phenomenon induced by the stray inductance 31 of the circuit and capacitor 30 but such resonance phenomenon can also be dissipated within a comparatively short period like the first embodiment due to the effect of constant voltage diode 29.

Figure 7:
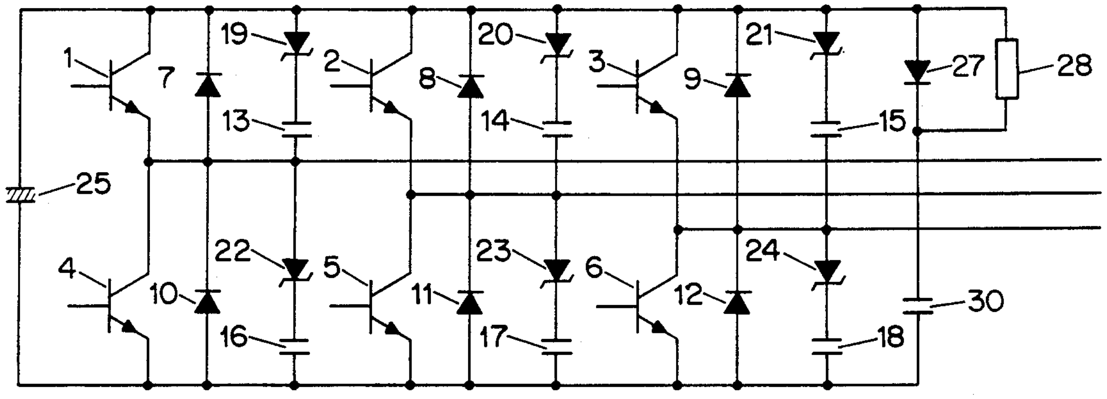
FIG. 7 is a circuit diagram indicating the connection of an RCD snubber circuit working in conjunction with the power conversion assembly of the present invention.

FIG. 7 is a circuit diagram indicating the third embodiment of three single phase power conversion assemblies of the present invention, wherein a series circuit of the constant voltage (Zener) diode and capacitor are connected as shown in the first embodiment circuit shown in FIG. 1, with each arm of the 3-phase inverter formed by the six power transistors 1 to 6 and six free wheeling diodes 7 to 12 and the R-C-D snubber circuit formed by the diode 27, resistor 28 and capacitor 30 connected between the positive and negative electrodes of D.C. supply 25.

Figure 8:
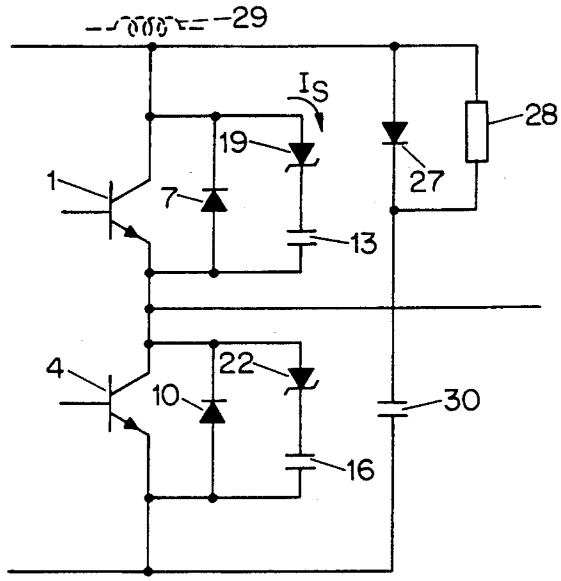
FIG. 8 is a circuit diagram of single phase power conversion assembly and snubber used for the embodiment shown in FIG. 7.

FIG. 8 is a circuit diagram of the circuit for a single phase of power conversion and snubber circuit used in the third embodiment of the snubber circuit shown in FIG. 7.

In FIG. 8, operations of snubber circuit formed by the constant voltage diodes respectively connected in parallel with the power transistors 1 and 4 and the capacitor are the same as that of the first embodiment circuit already described with reference to FIG. 1 and FIG. 2 and are not described again.

For example, when the power transistor 1 turns OFF and its collector to emitter voltage exceeds a voltage of the DC power supply 25, the R-C-D snubber formed by the diode 27, resistor 28 and capacitor 30 protects the power transistor 1 from breakdown through the operation of diode 27. Diode 27 turns on and capacitor 30 absorbs the surge voltage generated by the stray inductance 29.

Moreover, since the excessive electrical charge generated by the surge voltage accumulated in the capacitor 30 after power transistor 1 turns OFF is discharged through the resistor 28, resonance of capacitor 30 and stray inductance 29 can be minimized by adequately selecting a resistance value of the resistor 28.

Figure 9:
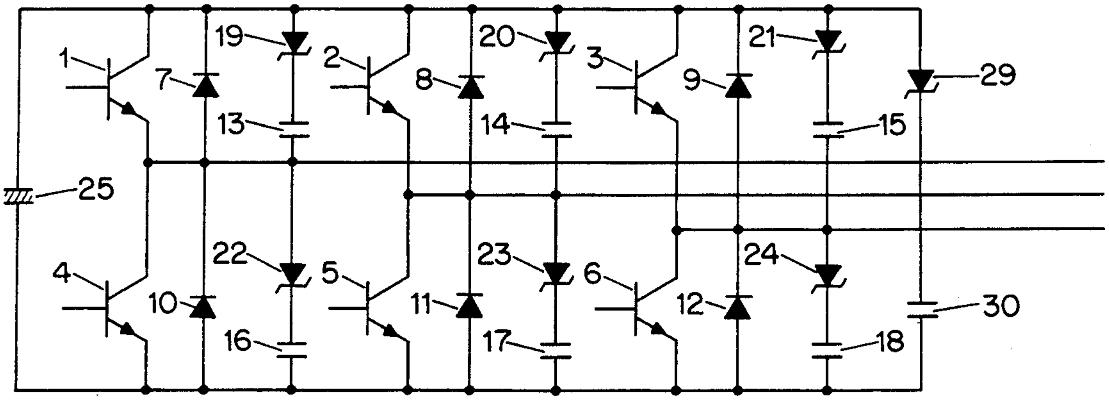
FIG. 9 is a circuit diagram of yet another configuration of the snubber circuit of the present invention working in conjunction with the power conversion assembly of FIG. 1.

FIG. 9 is a circuit diagram indicating the fourth embodiment of the power conversion assemblies of the present invention. This is the combination of the first embodiment circuit described in regard to FIG. 1 and FIG. 2 and the second embodiment circuit described in regard to FIG. 5 and FIG. 6. Explanation of this circuit diagram is therefore omitted here.

FIG. 10 is a structure of the first embodiment of a power conversion module (module unit) of the present invention, depicting a structure of the snubber circuit of the present invention shown in FIG. 2.

A ceramics substrate 51 which has excellent heat conductivity is bonded as an insulated substrate on a copper base 50 as a conductive plate, a copper pattern 52 as a conductive pattern machined in the desired shape, a first electrode 53, a second electrode 54 and a base terminal 56 are separately attached on this ceramics substrate 51 and therefore these are electrically insulated.

Since the collector 55, which will be understood to represent the collector of power transistor 1 in FIGS. 1 and 2, of power transistor 1, as the self turn off power semiconductor element, cathode of free wheeling diode 7 and anode of constant voltage diode 19 are closely attached to the copper pattern 52, these are electrically connected and at the same voltage potential.

With such an arrangement, heat generated by the power transistor 1, free wheeling diode 7 and Zener diode 19 is transmitted to the copper base 50 through the ceramics substrate 51. Thereby, heat loss generated in these semiconductor elements is quickly and effectively removed by cooling this copper base 50.

Each semiconductor element described above and capacitor 13 can be arranged in three dimensions and the module structure can be formed in a small size by connecting the one terminal of capacitor 13 forming the snubber circuit to the first electrode 53, the other terminal of capacitor 13 to the second electrode 54. Both electrodes 53 and 54 mechanically support capacitor 13.

The circuit for one arm shown in FIG. 2 can be completed by connecting, with wire bonding, between semiconductor elements on the copper pattern 52 and electrodes and terminals on the ceramics substrate 51, namely between the cathode of constant voltage diode 19 and first electrode 53, between the emitter of power transistor 1 and second electrode 54, between the anode of free wheeling diode 7 and second electrode 54 and between the base of power transistor 1 and base terminal 56.

This module, or assembly can be connected to the external world, i.e.—into a power conversion assembly, together with the base terminal 56, by connecting the collector terminal 55 on the copper pattern 52 and using the second electrode 54 as the emitter terminal.

In FIG. 10, the module for one arm of the snubber circuit is mounted, or placed on the copper base 50. It is clear that the modules for plural arms can naturally be loaded on a larger base (50) to expand the number of assemblies integrated in one package.

In the first embodiment of module unit shown in FIG. 10, the capacitor 13 of snubber circuit is included. Since this capacitor 13 is comparatively large in comparison with other elements and remaining elements, other than this capacitor 13 are all semiconductor parts, it is generally preferable to form the module unit only with these semiconductor parts to facilitate the cooling process.

FIG. 11 is a circuit diagram to form a module unit consisting only of semiconductor parts. The capacitor 13 is omitted from the circuit shown in FIG. 2. In the case of such circuit structure, the emitter terminal 64, collector terminal 65, base terminal 66 and snubber circuit terminal 67 are provided.

FIG. 12 is an external view of the module unit of a semiconductor element for power conversion formed by the circuit shown in FIG. 11.

In FIG. 12, the power transistor 1 as the self turn off power semiconductor element, free wheeling diode 7 reversely connected in parallel with this power transistor and the constant voltage (Zener) diode 19 connecting its anode electrode to the collector electrode of power transistor 1 are hermetically sealed in the synthetic resin molded to form a module unit 60. The first level or surface of this module unit 60 is provided with the emitter terminal 64 (E), collector terminal 65 (C). The second, lower level is provided with base terminal 66 (B) and snubber circuit terminal 67 (K) for external connections.

Figure 13A:
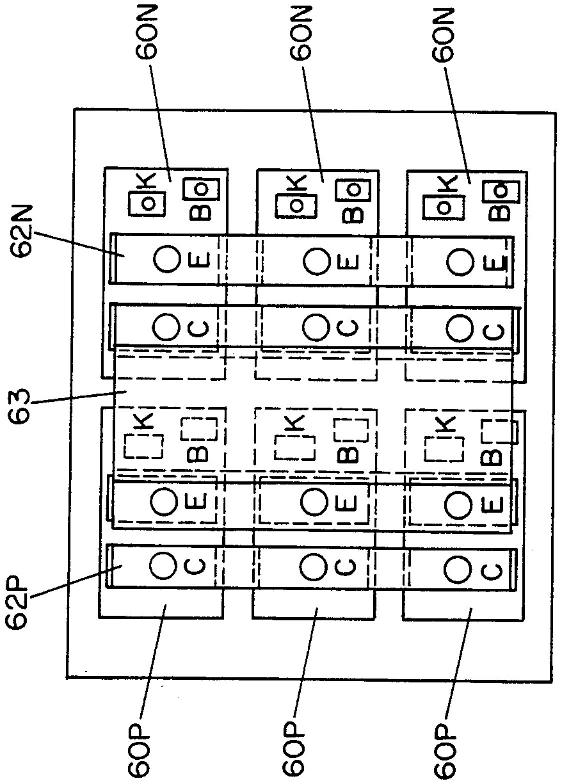
FIG. 13 is an assembly diagram for a single phase configuration of the power conversion assembly using six of the module unit shown in FIG. 12.
Figure 13B:
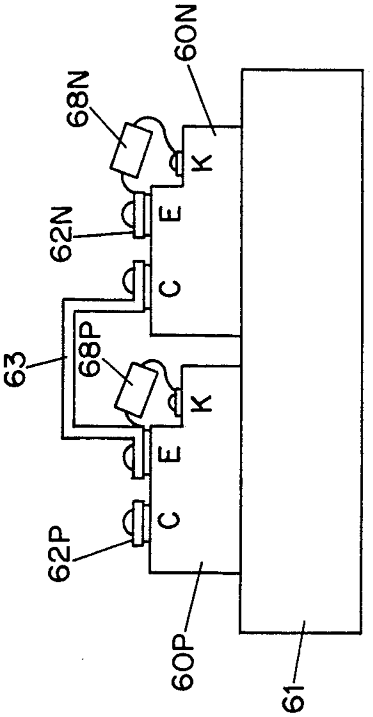

FIG. 13 is an assembly diagram showing the circuit for a single phase of the power converting unit utilizing the module unit shown in FIG. 12. FIG. 13(*a*) is a plan view and (*b*) is a side elevation.

In FIG. 13, the upper arm or section for a single phase of the power conversion unit is formed by mutually connecting in parallel collector terminals of three positive side module units 60P using the positive bus bar, shown as copper bar 62P. Moreover, the lower arm is formed by mutually connecting in parallel the emitter terminals of three negative side module units 60N using the negative copper bar 62N.

Three module units 60P connected in parallel for the upper arm and three module units 60N connected in parallel for the lower arm are loaded on the common cooling body 61 and the emitter terminals of the upper arm are connected to the collector terminal of the lower arm with a connecting copper bar 63. In this case, the connecting copper bar 63 must be formed in the shape of two parallel bars spaced apart and connected by a raised channel portion, as shown in cross-section in FIG. 13*b*, in order to provide the mounting space required by the snubber capacitor 68P attached to the module unit 60P of the upper arm. By forming the connecting bar as a raised channel, the connecting copper bar 63 requires excessive material, resulting in the disadvantage that not only the size and weight of the unit increases, but also that the wiring inductance increases.

The second embodiment shown in FIG. 14 also forms a module unit 70 by hermetically sealing, in the synthetic resin mold, the circuit shown in FIG. 11, namely the circuit formed by the power transistor 1, free wheeling diode 7 and constant voltage (Zener) diode 19. This module unit 70 is also provided, like FIG. 12, with the emitter terminal 64, collector terminal 65, base terminal 66 and snubber circuit terminal 67 for external connectors.

In the present invention, a cutout part 71 is provided to a part of the module unit 70 and the snubber capacitor 78 can be accommodated within this cutout part 71.

Figure 15A:
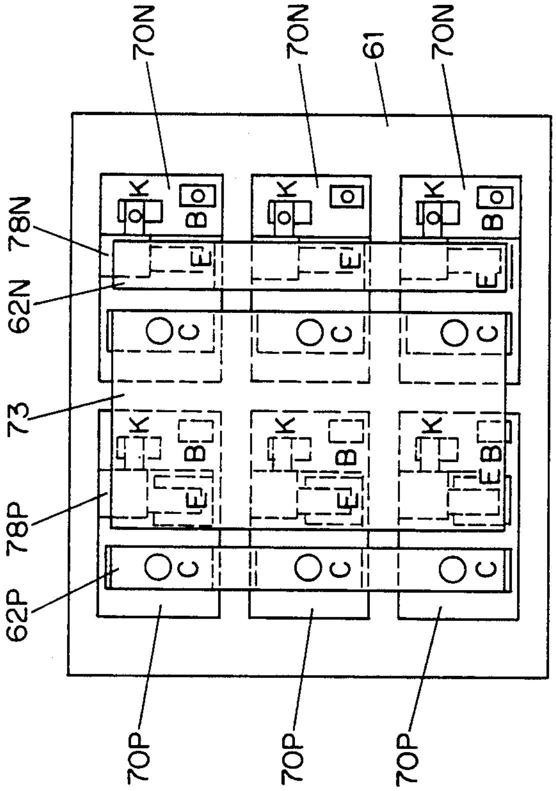
FIG. 15 is another assembly diagram of single phase power conversion assembly using the module unit shown in FIG. 14.
Figure 15B:
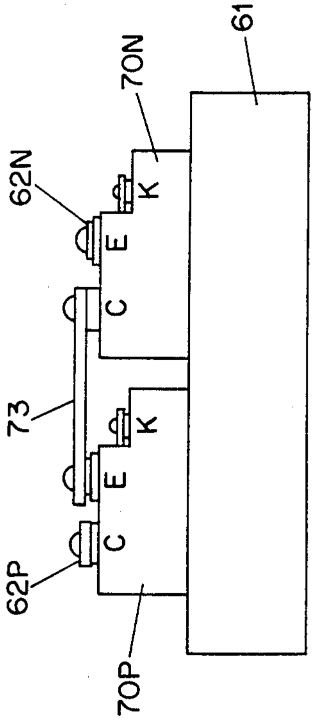

FIG. 15 is an assembly diagram of the circuit for a single phase of the power conversion unit using the module unit of second embodiment shown in FIG. 14. FIG. 15(*a*) is a plan view and (*b*) is a side elevation.

In FIG. 15 also, the collector terminals of three positive side module unit 70P are connected in parallel with the positive copper bar 62P to form the upper arm for the single phase. The emitter terminals of three negative side module units 70N are connected in parallel with the negative copper bar 62N to form the lower arm.

Means for providing D.C. power to the assembly can be a source of D.C. power such as a D.C. power supply or a pair of terminals through which D.C. power is passed to the assembly.

These six modules units are loaded on the cooling body 61 and the upper arm and lower arm are connected with the connecting copper bar 73. Since the snubber capacitor 78 for the upper arm is accommodated fully in the cutout provided to the module unit 70, it is no longer necessary to form the connecting copper bar 73 in the special shape as before.

Figure 16:
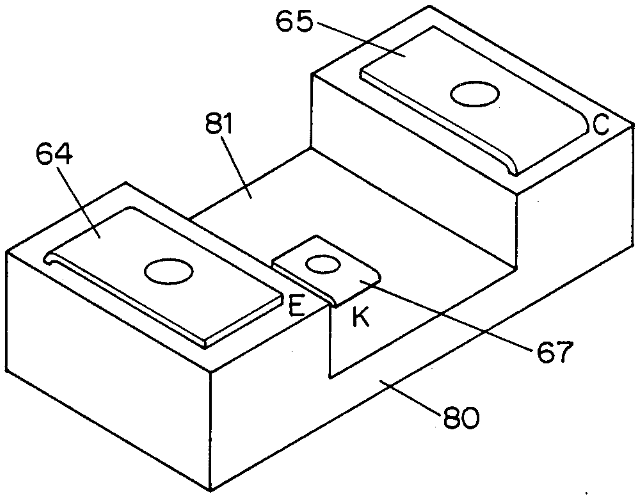
FIG. 16 is an external view of yet another embodiment of the power conversion module of the present invention.

FIG. 16 is an external view of the third embodiment of the module unit of the present invention.

The third embodiment shown in FIG. 16 encapsulates the circuit shown in FIG. 11, namely the circuit formed by the power transistor 1, free wheeling diode 7 and the constant voltage diode 19 within a synthetic resin mold to form a module unit 80 with the rectangular-parallel-piped shape. This rectangular-parallel piped module unit 80 forms a recessed part 81 at the center thereof to provide the snubber circuit terminal 67 in such recessed area 81. The emitter terminal 64 and collector terminal 65 are individually provided in both sides of the recessed area 81. The base terminal is adjacent to the "K" terminal, but not visible.

Figure 17:
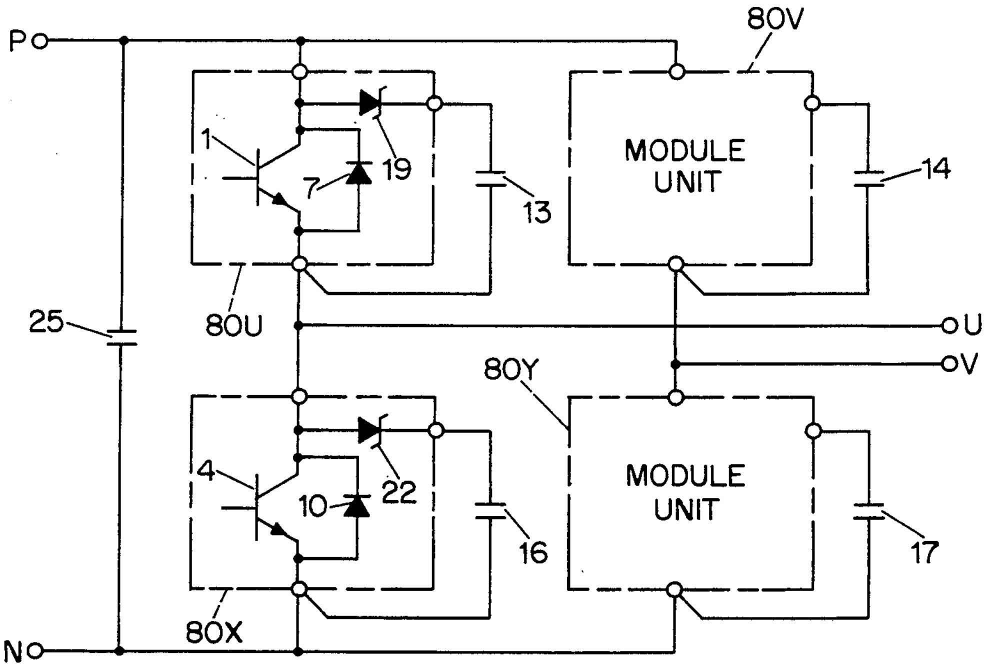
FIG. 17 is a circuit diagram of a power conversion assembly.

FIG. 17 is a circuit diagram indicating a single phase inverter wherein four third embodiment module units 80U, 80V, 80X, 80Y shown in FIG. 16 are connected with the single phase bridges, and respective module units are connected with the snubber capacitors.

Figure 18:
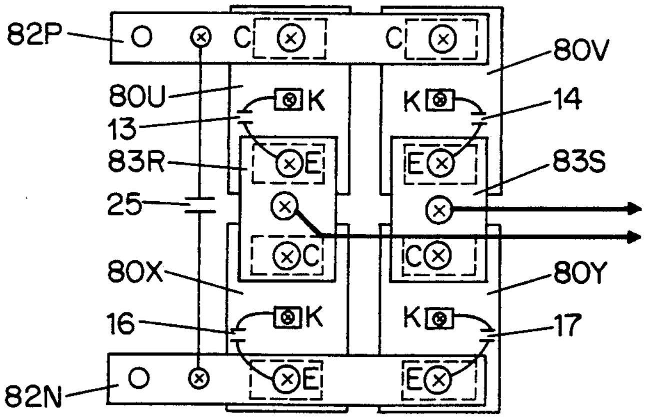
FIG. 18 is an assembly diagram of a single phase configuration power conversion module shown in FIG. 17 using the third embodiment shown in FIG. 16.

FIG. 18 is an assembly diagram of a single phase inverter shown in FIG. 17 using module units of the third embodiment shown in FIG. 16.

As shown in FIG. 18, the collector terminals of two module units 80U and 80V are connected with the positive copper bar 82P, the emitter terminals of two module units 80X and 80Y are connected with the negative copper bar 82N and connection between the upper arm and lower arm of the first phase is made with the connecting copper bar 83R, while connection between the upper arm and lower arm of the second phase is made with the connecting copper bar 83S, to form the single phase inverter.

In this case, since the snubber capacitors 13, 14, 16, 17 assembled into module units are accommodated in the recessed area 81 of the respective module units, there is no unnecessary projected areas on the single phase inverter and the unit as a whole may be configured compactly.

Respective embodiments of the present invention have been explained using the power transistor as the semiconductor element but it is obvious that such embodiments may also be applied to the case where the power transistor is replaced with a different type of self turn off power semiconductor element, for example, an insulated gate bipolar transistor or a field effect transistor.

A self-turn off power semiconductor element is any solid state device capable of interrupting a current flow between its main terminals in response to a signal either removed or applied to its control terminal.

This should be contrasted with a non-self-turn-off device such as a silicon controlled rectifier (SCR or thyristor) that can only turn OFF when the current flowing through it drops to zero. Furthermore, a control signal applied during the conduction period does not interrupt the flow of current through the main power terminals.

For example, a typical power transistor will interrupt the current flowing through it when the base drive is removed. A power Field Effect Transistor (FET) will likewise stop conducting when the gate drive is removed. Some four layer gate-turn off devices, similar to SCR's in structure, but not operation, would also be considered self-turn off under this definition, as long as a turn-off signal can operate to stop current flow.

Benefits of the Invention

According to the present invention, the resonant current of a snubber circuit can be efficiently attenuated by connecting in parallel the snubber circuit described herein, the snubber is formed by connecting an asymmetrical element such as a constant voltage (Zener) diode in series with a capacitor, to individual self turn off power semiconductor elements forming a power conversion unit or between the positive and negative electrodes of the power conversion unit. The resonance of the capacitor for the snubber network can be suppressed and energy loss can also be reduced by omitting the resistor in the snubber network. In addition, elimination of the resistor in the snubber provides various beneficial effects such as the reduction in the number of parts, simplification and reduction in the size of the snubber circuit. The module can be formed small in size and it may be handled as one part since the turn off power semiconductor element, free wheeling diode and Zener diode are part of the module itself. The physical location of the semiconductors is chosen to effectively radiate or transmit heat generated by the semiconductor elements to the outside world, while providing space for a capacitor which is larger than the other elements in volume. Therefore, the installing, wiring and part management procedures of the separate parts may be omitted or reduced. Moreover, because a space for accommodating the snubber capacitor is provided in the module as a cutout area or as a recessed area at the time of forming such module when hermetically sealing the semiconductor elements into the synthetic resin mold, the snubber capacitor does not interfere with the wiring during assembly of the power conversion unit. Thereby, direct wiring can be achieved and various effects such as saving of wiring material, reduction of wiring inductance, reduction in size and weight of unit can also be attained.

While there have been described what are at present considered to be the preferred embodiments of this invention, it will be obvious to those skilled in the art that various changes and modifications may be made therein without departing from the invention and it is, therefore, intended to cover all changes and variations as fall within the true spirit and scope of the invention.

I claim:

1. A power conversion section for use in a DC to AC power conversion assembly having a snubber network for use with self turn off semiconductor elements, comprising:

a semiconductor element arranged to alternatively turn on and self turn off in response to control signals;

a snubber circuit, coupled in parallel with said semiconductor elements, comprising Zener diode means, providing a predetermined voltage drop during forward conduction and a larger voltage drop during backward conduction, for asymmetrically dissipating energy applied therethrough, coupled in series with a means for storing an electrical charge;

whereby, interaction of the Zener diode means and the charge storage means resulting from said Zener diode means' asymmetrical voltage drop characteristic permits effective surface reduction with limited energy loss as a result of asymmetrical energy dissipation.

2. A power conversion section as described in claim 1, wherein said electric charge storage means is a capacitor.

3. A single phase power conversion assembly comprising:

means for providing DC power; and first and second power conversion sections, each as described in claim 1, coupled in series across said DC power means so as to provide at a point between said first and second sections a signal representing an AC output.

4. A power conversion assembly as described in claim 3, wherein a free wheeling diode is coupled in parallel with each said first and second power conversion sections.

5. A single phase power conversion assembly as described in claim 3, further comprising an additional snubber circuit, coupled in parallel across both said series coupled first and second power conversion sections, having Zener diode means, providing a predetermined voltage drop during forward conduction and a larger voltage drop during backward conduction, for asymmetrically dissipating energy applied therethrough, coupled in series with means for storing an electrical charge.

6. A DC to three phase AC power conversion assembly, comprising:

means for providing DC power;

three single phase power conversion assemblies, each as described in claim 3, each assembly of said first and second power conversion sections coupled across said DC power means and arranged to provide at respective points between the first and second power conversion sections of each single phase assembly a signal representing an AC output of one of three phases in response to a control signal.

7. A three phase power conversion assembly as described in claim 6, further comprising an additional snubber circuit, coupled in parallel across said power conversion assemblies, for providing a predetermined voltage drop during forward conduction and a larger voltage drop during backwards conduction coupled in series with means for storing electrical charge.

8. A single phase power conversion assembly as in claim 3 additionally comprising a snubber network made up of the parallel combination of a resistor and diode, in series with a capacitor, connected in parallel across said first and second power conversion sections.

9. A DC to three phase AC power conversion assembly comprising:

means for providing DC power, three single phase conversion assemblies, each said assembly comprising two series connected self turn off semiconductor elements paralleled by free wheeling diodes, further comprising a snubber circuit, coupled in parallel across said means for providing DC power, said snubber circuit having Zener diode means, providing a predetermined voltage drop during forward conduction and a larger voltage drop during backward conduction, for asymmetrically dissipating energy applied therethrough, coupled in series with a means for storing electrical charge.

10. A power conversion assembly as recited in claim 9, wherein the electrical charge storage elements are capacitors.

11. A power conversion section for use in a DC to AC power conversion assembly having a snubber network for use with self turn off semiconductor elements, comprising:

a semiconductor element arranged to alternatively turn on and self turn off in respond to control signals;

a snubber circuit, coupled in parallel with said semiconductor element, comprising a constant voltage drop semiconductor means, providing a predetermined voltage drop during forward conduction and a larger voltage drop during backward conduction, for asymmetrically dissipating energy applied therethrough, coupled in series with a means for storing an electrical charge;

whereby, interaction of the constant voltage drop semiconductor means and the charge storage means resulting from said constant voltage drop characteristic permits effective surge reduction with limited energy loss as a result of asymmetrical energy dissipation.

12. A power conversion section as described in claim 11, wherein said electric charge storage means is a capacitor.

13. A single phase power conversion assembly comprising:

means for providing DC power; and first and second power conversion sections, each as described in claim 11, coupled in series across said DC power means so as to provide at a point between said first and second sections a signal representing an AC output.

14. A power conversion assembly as described in claim 13, wherein a free wheeling diode is coupled in parallel with each said first and second power conversion sections.

15. A single phase power conversion assembly as described in claim 13, further comprising an additional snubber circuit, coupled in parallel across both said series coupled first and second power conversion sections, having a constant voltage drop semiconductor means, providing a predetermined voltage drop during forward conduction and a larger voltage drop during backward conduction, for asymmetrically dissipating energy applied therethrough, coupled in a series with means of restoring an electrical charge.

16. A DC to three phase AC power conversion assembly, comprising:

means for providing DC power;

three single phase power conversion assemblies, each as described in claim 11, each assembly of said first and second power conversion sections coupled across said DC power means and arranged to provide at respective points between the first and second power conversion sections of each single phase assembly a signal representing an AC output of one of three phases in response to a control signal.

17. A three phase power conversion assembly as described in claim 16, further comprising an additional snubber circuit, coupled in parallel across said power conversion assemblies, for providing a predetermined voltage drop during forward conduction and a larger voltage drop during backwards conduction coupled in series with means for storing electrical charge.

18. A single phase power conversion assembly as in claim 13 additionally comprising a snubber network made up of the parallel combination of a resistor and diode, in series with a capacitor, connected in parallel across said first and second power conversion sections.

19. A DC to three phase AC power conversion assembly comprising:

means for providing DC power, three single phase conversion assemblies, each said assembly comprising two series connected self turn off semiconductor elements paralleled by free wheeling diodes, further comprising a snubber circuit, coupled in parallel across said means for producing DC power, said snubber circuit having a constant voltage drop semiconductor means, providing a predetermined voltage drop during forward conduction and a larger voltage drop during backward conduction, for asymmetrically dissipating energy applied therethrough, coupled in series with a means for storing electrical charge.

* * * * *

UNITED STATES PATENT AND TRADEMARK OFFICE
CERTIFICATE OF CORRECTION

PATENT NO. : 5,055,990

DATED : October 8, 1991

INVENTOR(S) : Miki et al.

It is certified that error appears in the above-identified patent and that said Letters Patent is hereby corrected as shown below:

Column 4, line 48, "he" should read --the--;

Column 7, line 15, "Is" should read --$I_s$--;

Column 13, line 48, "respond" should read --response--;

Column 14, line 30, "claim 11" should read --claim 13--.

Signed and Sealed this

Twenty-fifth Day of May, 1993

Attest:

Michael K. Kirk

MICHAEL K. KIRK

Attesting Officer

*Acting Commissioner of Patents and Trademarks*